United States Patent [19]
Brahme et al.

[11] Patent Number: 5,878,050
[45] Date of Patent: Mar. 2, 1999

[54] METHOD AND APPARATUS FOR DATA COMPARE DETECTION OF MEMORY ERRORS ON A COMPUTERS MEMORY SUBSYSTEM

[75] Inventors: Upendra S. Brahme, Fremont; Keith E. Thompson, Hayward; Raymond E. Keefer, Fremont; Van Lam, Milpitas, all of Calif.

[73] Assignee: Sun Microsystems, Inc., Palo Alto, Calif.

[21] Appl. No.: 873,448

[22] Filed: Jun. 12, 1997

[51] Int. Cl.⁶ ........................................... G06F 11/00
[52] U.S. Cl. ............................................... 371/21.2
[58] Field of Search .................... 371/21.2, 21.6, 371/21.1, 21.5, 83, 65, 67.1; 324/158 R

[56] References Cited

U.S. PATENT DOCUMENTS 5,175,495  12/1992  Brahme et al. .................... 324/158 R

*Primary Examiner*—Vincent P. Canney
*Attorney, Agent, or Firm*—Graham & James LLP

[57] ABSTRACT

A data compare technique for detecting memory errors on a computer's memory subsystem is disclosed. The technique simulates memory intensive software to determine if memory errors occur when the computer's memory subsystem is subjected to heavy memory usage. The technique copies an extensive test file, performs checksums of the original and copied test files and compares the checksum of the original file to the checksum of each copied file to identify checksum differences. The checksum differences indicate the occurrence of a memory error.

20 Claims, 6 Drawing Sheets

METHOD AND APPARATUS FOR DATA COMPARE DETECTION OF MEMORY ERRORS ON A COMPUTERS MEMORY SUBSYSTEM

TECHNICAL FIELD OF THE APPLICATION

This invention relates generally to a method and apparatus for detecting memory errors on a computer system, and more specifically, to a method and apparatus for comparing data to detect caching errors on a computer's memory subsystem.

BACKGROUND OF THE INVENTION

Modern computer software programs can perform extremely complex tasks.

For example, CAD (Computer-Aided Design) software facilitates the design of electronic circuits by providing a user with a set of software tools running on a computer. Software applications, such as CAD, are memory intensive software applications that generate significantly large databases.

Memory intensive software applications, such as CAD, place enormous processing demands on a computer's memory subsystem. It is important to ensure that the memory subsystem can support the memory intensive requirements of these programs. Accordingly, a computer's memory subsystem should be tested to detect memory errors that will likely impact the accuracy and performance of memory intensive applications.

Since modern computer memory subsystems interact with processors that employ hundreds of thousands of gates, and more than a million individual transistors, testing to detect memory errors can be a timely and costly process. For example, memory errors that may occur when large quantities of data are transferred through memory can be difficult to detect during testing and can be even more difficult to reproduce once detected.

Due to the complexity of modern processors and computer memory subsystems, conventional memory testing systems execute a multitude of different software applications with different memory requirements to determine whether running the processor with its computer memory subsystem yields memory errors. Such testing is a difficult and time consuming process. Further, testing is expensive, since each of the software applications is likely to be proprietary and require a sub-licensing fee for its use.

Other conventional systems, such as Validation Test Suite (VTS) system of Sun Microsystems, Inc., test each component of a micro computer, such as memory, video, disc, serial ports and virtual memory. Although comprehensive, VTS processing requires significant physical memory resources. For example, VTS requires at least 8 megabytes of memory to perform system tests. This high memory demand limits its ability to detect memory errors.

Another limitation of conventional systems, such as VTS, is the time required to test a plurality of microcomputer components. Since test suite systems generally test a plurality of components, the testing software is not specifically tailored to detect caching errors. Accordingly, additional or unnecessary tests may be performed that extend the time needed to detect memory errors.

Another limitation of conventional systems, is the length and complexity of the testing software. Application software that may detect memory errors, may require 20 gigabytes or more of disk space to install the program. When the software runs it generally requires significant physical memory that limit its ability to detect memory errors that may occur when data is read into physical memory from secondary memory.

Although conventional systems may detect memory errors, there remains an unmet need for a system that applies a basic methodology to detect memory errors when data is processed through memory, so that testing of a computer's memory subsystem does not require the execution of a multitude of different software applications. Further, the software of the system should require minimal disk and physical memory and should detect memory errors within a short time cycle.

SUMMARY OF THE INVENTION

The present invention provides for a method and apparatus for detecting data memory errors on a computer system. The present invention can be embodied as hardware, software stored on a medium such as a diskette, and software downloaded from the Internet. A preferred embodiment of the invention provides for a method and apparatus for detecting data caching errors in CPU modules on a computer system. An example CPU module is a "hyperSPARC" module installed on a "SPARCstation". ("HyperSPARC" and "SPARCstation" are registered trademarks of "SPARC" International, Inc. HyperSPARC is licensed exclusively to ROSS Technology, In., and SPARCserver is licensed to Sun Microsystems, Inc.)

The present invention performs a data-compare to detect memory errors that may occur during the swapping of data occurs between disk, also known as secondary memory, and physical memory of a computer. Memory errors occur when the swapping of data causes one or more bits of the data file to incorrectly flip, for example when a "1" flips to a "0" or a "0" flips to a "1." The present invention detects the memory error by simulating the swapping of data of a memory intensive software application.

The data compare test detects memory errors by exercising a computer's memory subsystem in a memory intensive manner. The memory intensive manner repeatedly copies an original data file to a plurality of a duplicate data files. The repeated copying of large data files causes repeated swapping of data where data is read and moved from disk to physical memory and then written back to hard disk. Repeated reading and writing of data between memory and disk simulates a memory intensive application that may cause a memory error, when a data bit incorrectly flips during the transfer of data through memory while swapping data between disk and memory in response to the copy command. By comparing the checksums of the original and copied data, the present invention detects flipped data bits, generally referred to as memory errors. More particularly, a difference between the checksums indicates a memory error where one or more bits incorrectly flipped during the file copy process.

In a preferred embodiment, this testing procedure may be used to detect defective CPU modules that may cause data caching errors. By identifying defective CPU modules before sending them to computer purchasers, this testing procedure will prevent field "Dead on Arrivals" (DOA's) and improve the general quality and reliability of the tested computer memory subsystems.

As described herein, the present invention is a method for performing data compare detection of a memory error of a computer memory subsystem, the method comprising the following steps, performed by a computer system having the memory subsystem, of: copying a test file from a secondary memory to create a plurality of other test files in the secondary memory, the copying step causing the test file to be written to the computer memory subsystem; generating a checksum value for the test file and for each of the other test files; and comparing the checksum value of the test file to the checksum value of each of the other test files, wherein if the checksum value of the test file is not equal to the checksum value of each of the other test files the method detects the memory error, wherein if the checksum value of the test file is equal to the checksum value of each of the other test files the method does not detect the memory error.

As described herein, the present invent is an apparatus for providing data compare detection of a memory error of a computer memory subsystem, the apparatus comprising: a first portion configured to copy a test file from a secondary memory to create a plurality of other test files in the secondary memory, the first portion causing the test file to be written to the computer memory subsystem to create a plurality of other test files; a second portion configured to generate a checksum value for the test file and for each of the other test files; and a third portion configured to compare the checksum value of the test file to the checksum value of each of the other test files, wherein if the checksum value of the test file is not equal to the checksum value of each of the other test files there is the memory error, wherein if the checksum value of the test file is equal to the checksum value of each of the other test tiles there is not the memory error.

Various advantages of the present invention will become more fully apparent when the following detailed descriptions of the invention are read in conjunction with the accompanying drawings.

BRIEF DESCRIPTION OF THE DRAWINGS

The invention will now be described with reference to the accompanying drawings, wherein:

Figure 6:
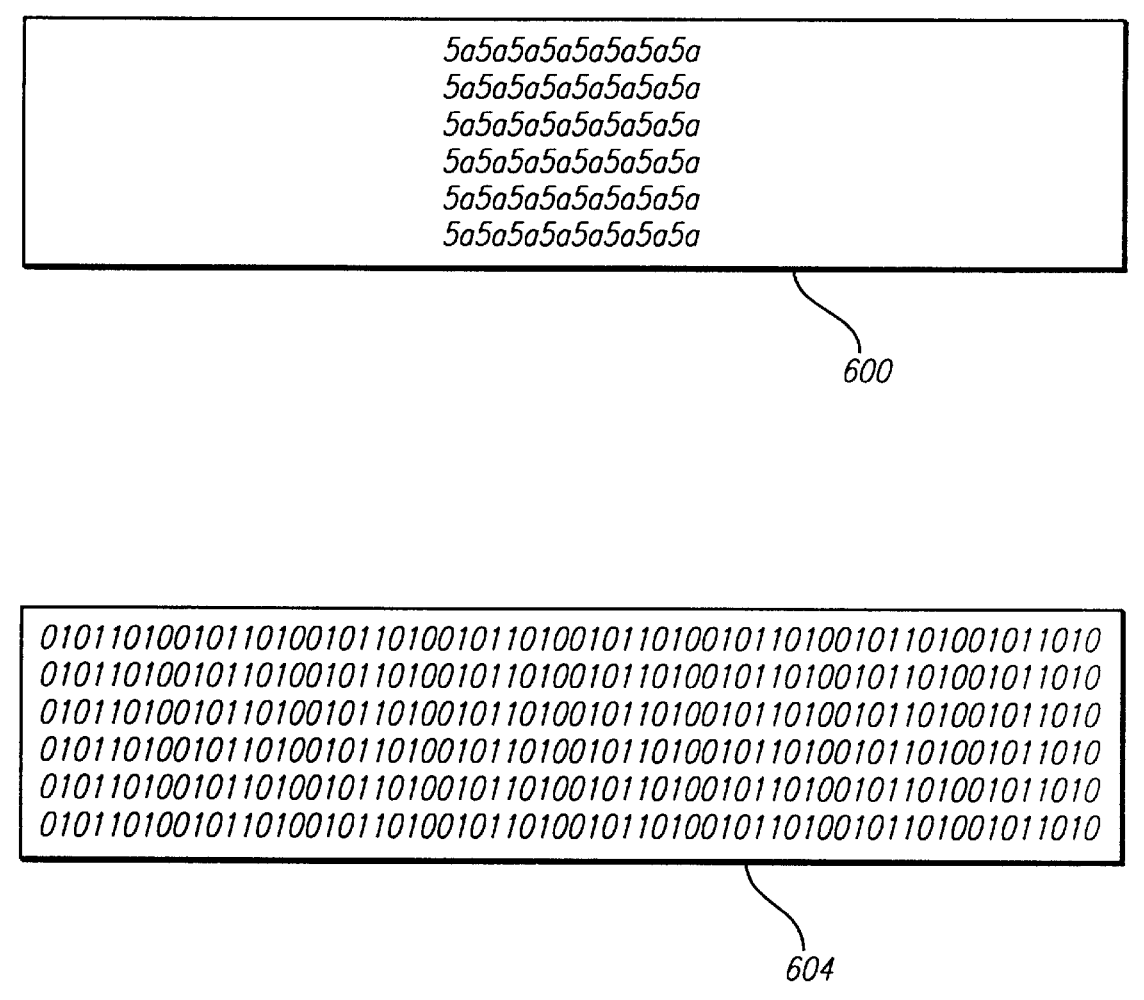

FIG. 6 shows a preferred embodiment of the test file.

DETAILED DESCRIPTION OF A PREFERRED EMBODIMENT

The following description is of the best presently contemplated mode of carrying out the invention. The description is made for the purpose of illustrating the general principles of the invention and is not to be taken in a limiting sense. The same reference numbers will be used to refer to the same or similar elements shown in the figures.

1. General Discussion

Figure 1:
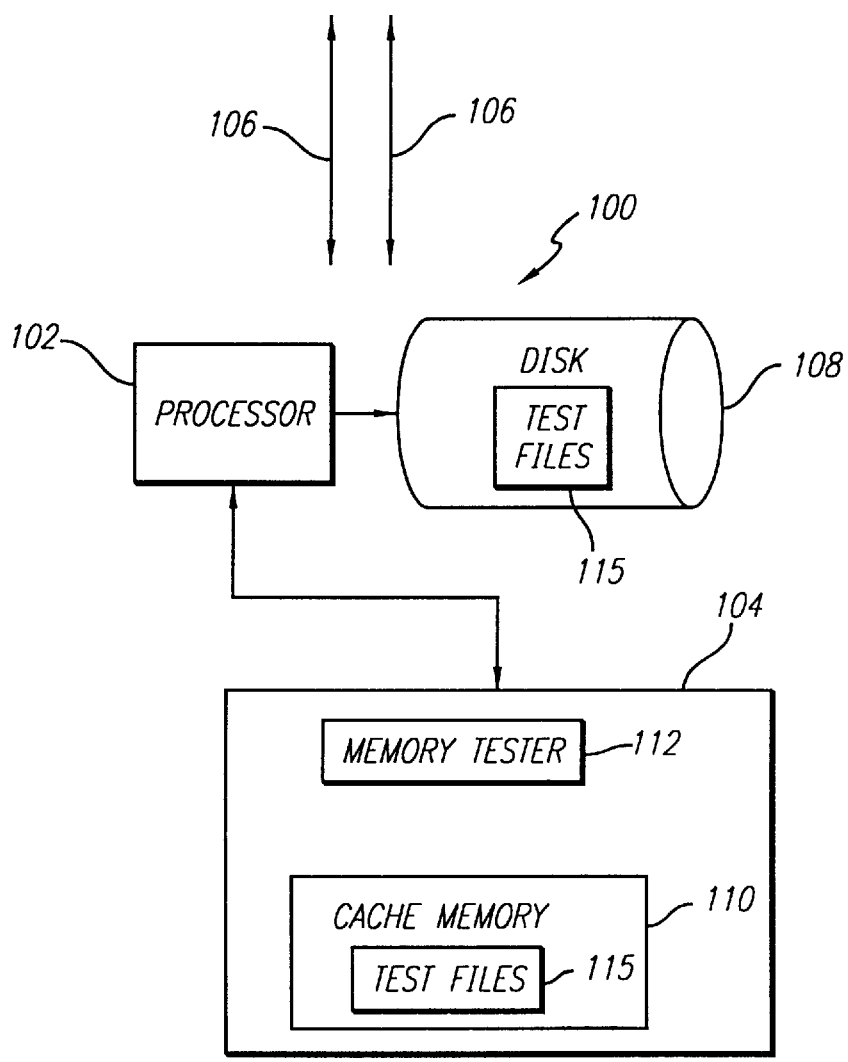
FIG. 1 is a diagram of a computer system in accordance with a preferred embodiment of the present invention.

FIG. 1 is a diagram of a computer system in accordance with a preferred embodiment of the present invention. Computer system 100 includes a processor 102, a memory 104, input/output lines 106, and a hard disk 108. The hard disk 108, also known as secondary memory, includes test files 115. It will be understood by a person of ordinary skill in the art that the computer system 100 can also include numerous elements not shown in the Figure for the sake of clarity, such as keyboards, display devices, network connections, additional memory, additional CPUs, etc.

Memory 104 includes a cache memory 110 and memory tester application program 112. The cache memory includes test files 110. A person of ordinary skill in the art will understand that memory 104 also contains additional information, such as source code, object code, other application programs, operating systems, etc., which are not shown in the figure for the sake of clarity.

Figure 2:
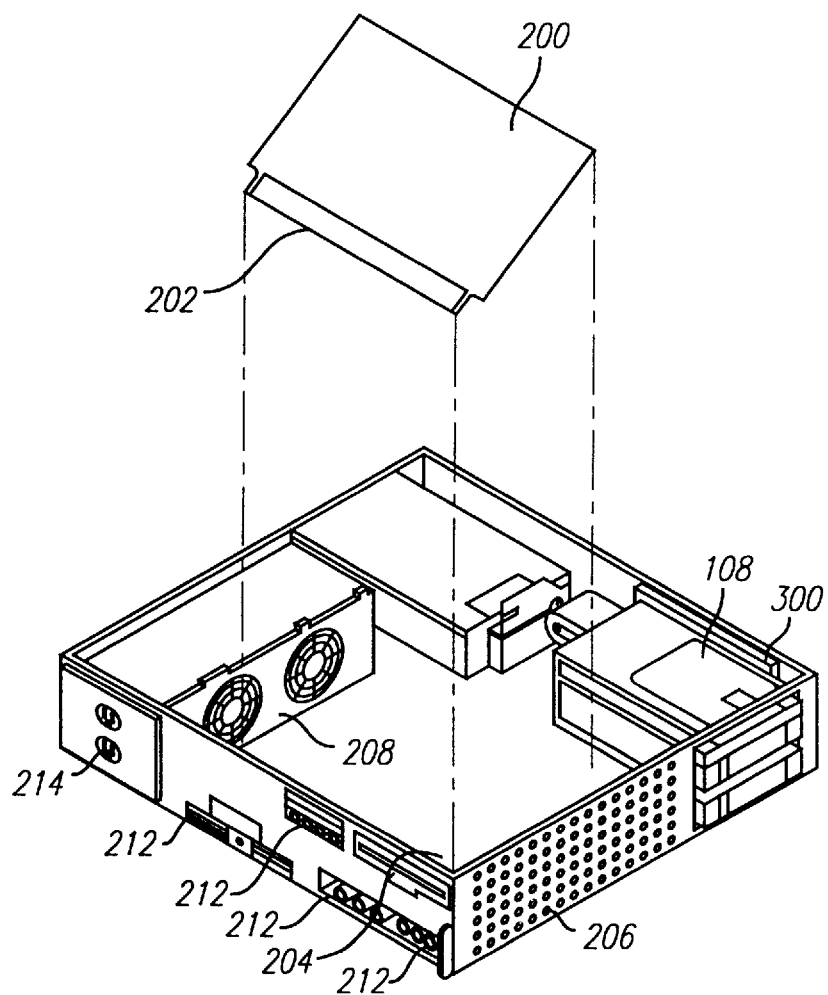
FIG. 2 is a perspective view of a CPU module being attached to the main logic board of the computer system of FIG. 1.

FIG. 2 shows a preferred embodiment of the computer system 100 of FIG. 1 where a CPU module 200 that includes the processor 102 (not shown) and the memory 104 (not shown), is being lowered for attachment to the main logic board 204 of the computer system of FIG. 1. An example CPU module 200 is a "hyperSPARC" module 200 that is attached via its highspeed interconnect bus 202 to the main logic board 204 of the computer 100. The casing of the computer 100 includes intake grates 206 along the side walls of the casing, a fan 208, a hard disk drive 108, a floppy disk drive 210, a plurality of serial and parallel ports 212 along the outer rear wall of its casing and a power cord port 214.

In a preferred embodiment the CPU module 200 may be installed on the main logic board 204 of the computer system 100 of FIG. 1. The ability to detect data caching errors should assist in ensuring that the CPU module 200 installed in the computer of FIG. 1 is appropriately tested so that it can perform memory intensive processing free from data caching errors.

Figure 3:
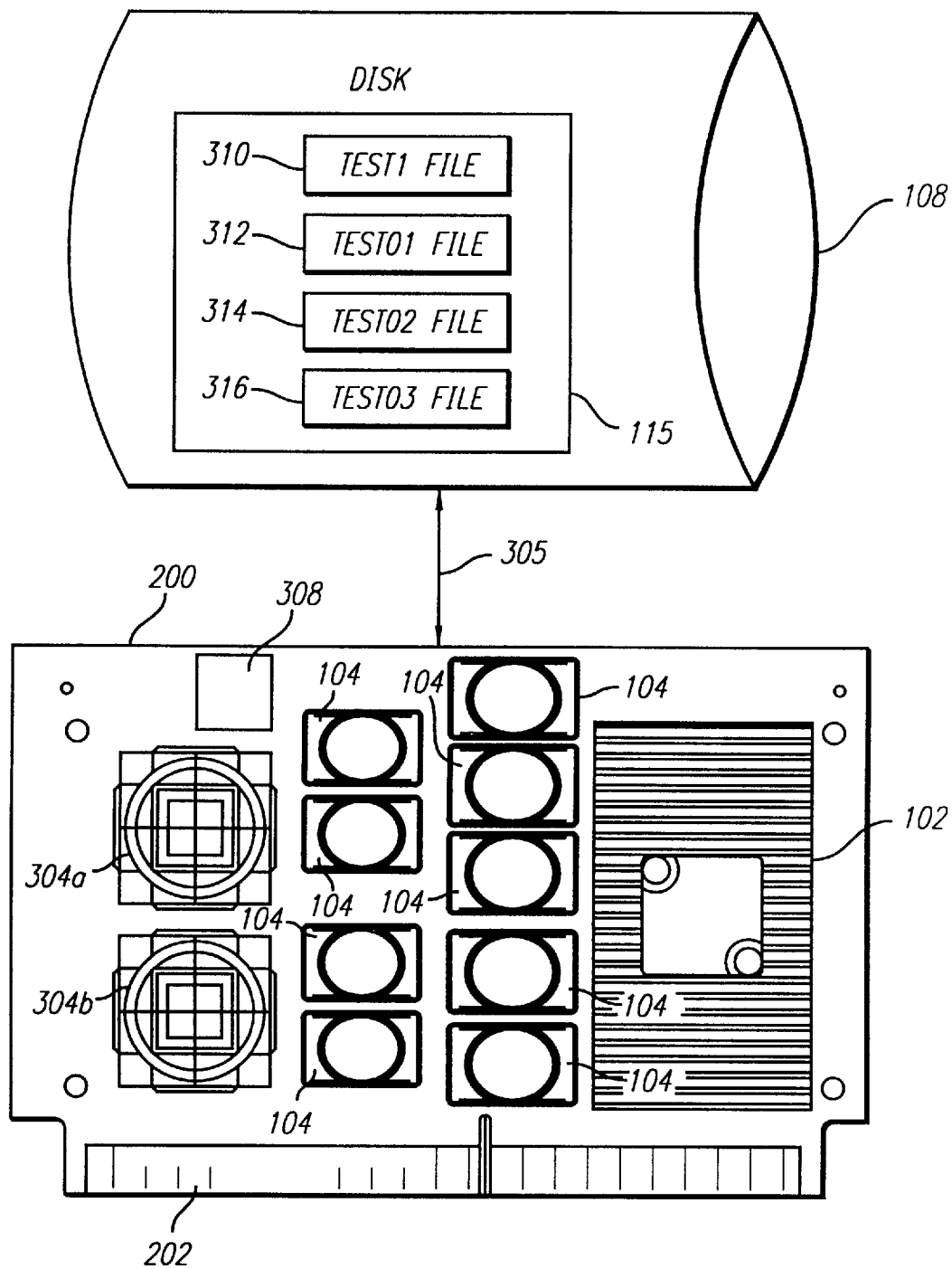
FIG. 3 is a detailed view of the CPU module and hard disk of FIG. 2.

FIG. 3 is a detailed view of the "hyperSPARC" module 200 and disk 108. The "hyperSPARC" module includes a processor 102, two data buffer chips (304a, 304b), a plurality of SRAM 104, a clock buffer 308 and the high-speed global connector 202. The module 200 is connected via an M-Bus 305 to the disk 108 of the computer 100. The disk 108 includes Test1 310, Test01 312, Test02 314 and Test03 316.

As shown, a preferred embodiment of the present invention includes SRAM 104 of 512 Kbytes of second-level cache. Alternative embodiments may include other second level cache sizes such as 256 or 1,024 Kbytes. A caching error may arise during the processing of large data files, of 12 megabytes or greater, on the computer system 100. For example, a memory intensive application, such as a CAD simulation program generates and processes large data files. Particularly, in processing these memory intensive files, data is continuously read from disk 310 into memory 104 and then written back to disk 108. This transfer of memory intensive files through cache memory 110 of the CPU module 200 during processing may cause errors in cache 104. In FIG. 3 the cache memory 104 is shown as the plurality of SRAM 104.

Figure 4:
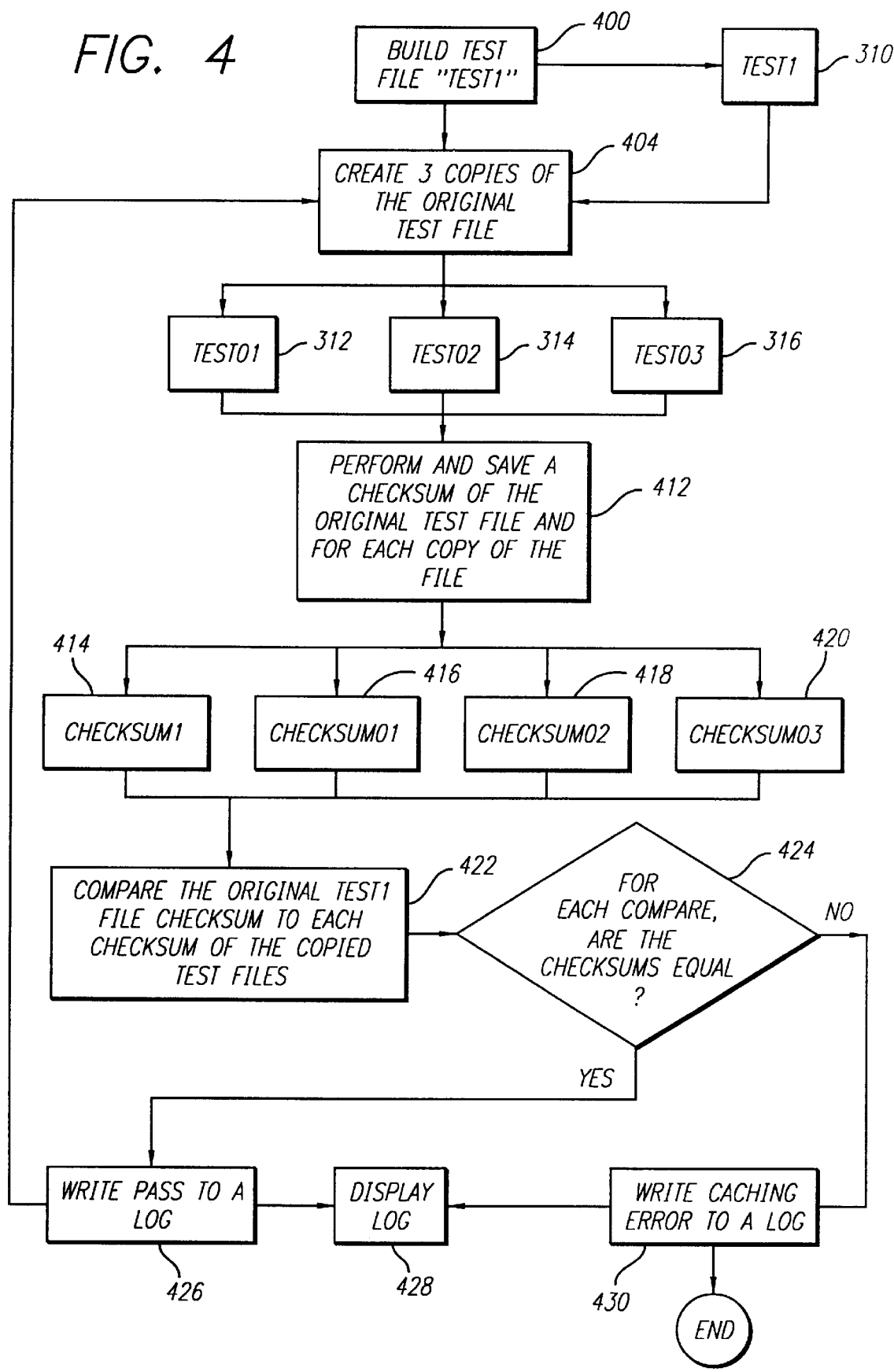
FIG. 4 is a flowchart showing a method of performing the data compare error detection of the computer system of FIG. 1.
Figure 5:
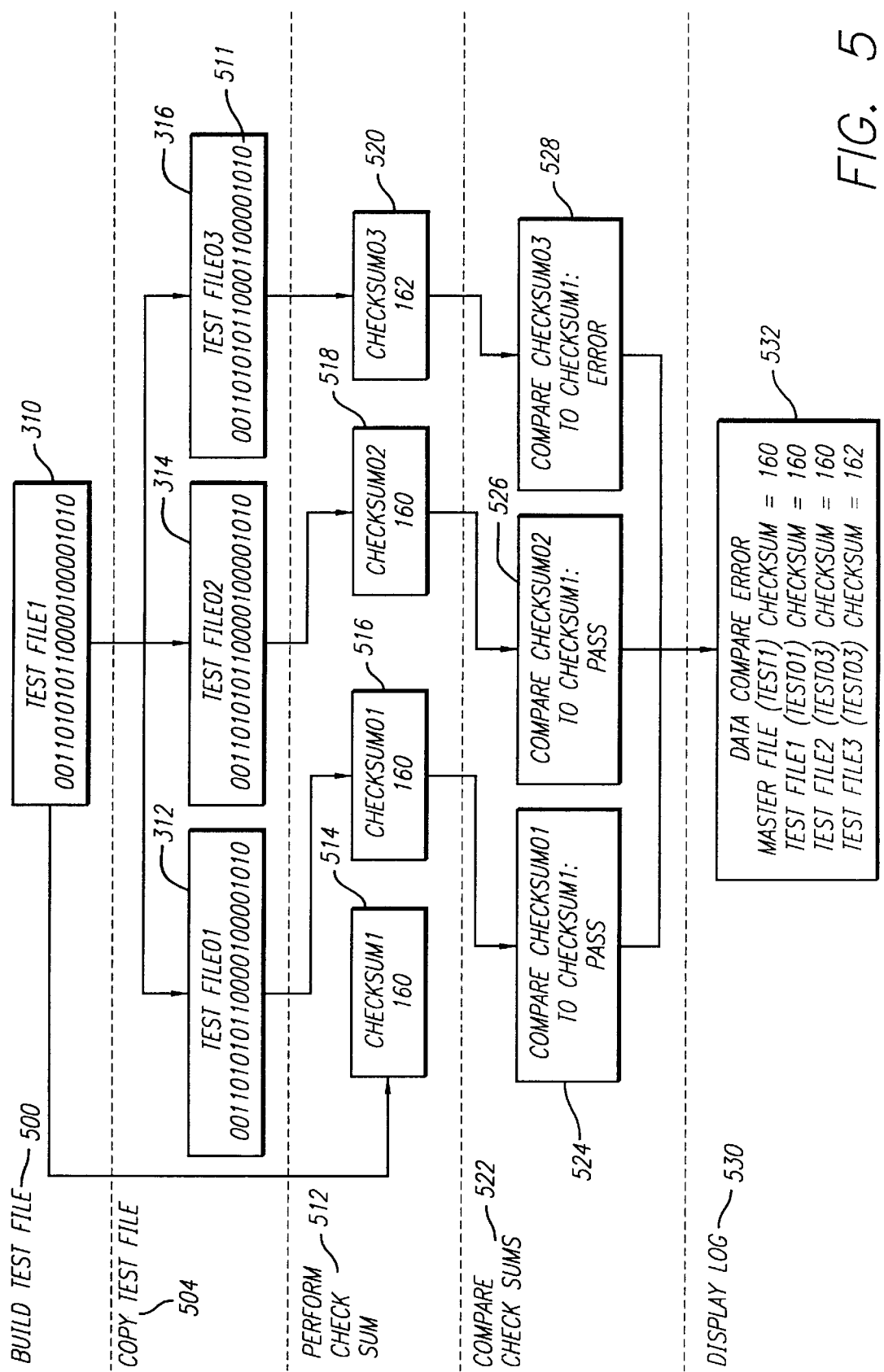
FIG. 5 is a flowchart showing an example of the data compare error detection of FIG. 4.

It is imperative, before installing and relying upon a CPU module 200 to process memory intensive programs, to determine whether the CPU module 200 may cause data caching errors that would corrupt a program's data files. FIGS. 4 and 5 discuss in detail how the present invention detects data caching errors that occur during CPU module processing.

FIG. 4 is a flowchart showing a method of performing a data compare detection of caching errors in the computer system of FIG. 1. In a preferred embodiment, the software program is a korn shell script. Alternative embodiments may use other programming languages to implement the present invention.

The data compare error detection includes the following steps:

In step 400, test file "Test1" 310 is created on disk 108 with a data sequence that is likely to detect data caching errors. FIG. 6 shows a preferred embodiment of the test file that includes a 4 bit alternating pattern of hexadecimal "5a" 600 and the corresponding binary of "01011010" 604. Although the test file "Test1" may include data of any data type supported by the computer system of FIG. 1, a data file of ASCII characters is preferred.

In step 400, an initial sequence of ones and zeros are continuously copied until the test file includes 15 megabytes of data. A test file of 15 megabytes is an optimal size when the computer system 100 includes memory cache 110 having 512 Kbytes, since data transfers in excess of at least 12 megabytes are usually effective in forcing a defective processor 102 and/or memory subsystem to yield a data caching error. Alternative embodiments of the present invention for testing other types of CPU modules that may include a different sized memory cache 110 may find other test file sizes more effective in detecting caching errors during CPU module processing.

In step 404, the present invention creates three copies of the original test file "Test1" 310. In a preferred embodiment, three sequential "cp" commands copy the original test file, "Test1" 310 to create three duplicate test files of "Test01" 312, "Test02" 314 and "Test03" 316. Although the present invention performs the data compare process with three files, alternative embodiments may include a different number of files. Factors to consider in determining the number of files to create to detect a caching error include processing time and the available memory 104 and disk 108 of the computer 100 performing the data compare testing.

When the CPU module 200 executes the copy command, the data is read from disk 108 to physical memory 104 and then is written back to disk 108. A copy command is used since copying a large data file simulates the transfer of data through memory of a memory intensive software application. Further, performing a copy command provides a copied data file to compare and contrast to the original data file. Thus, if the comparison detects a difference between the copied and original file, then the transfer of data through memory to copy the large data file caused one or more data bits of the copied file to incorrectly flip. This difference indicates the occurrence of a data caching error.

In step 412, the present invention performs a "checksum" of the original test file "Test1" 310 and of each of the three copied test files "Test01" 312, "Test02" 314 and "Test03" 316. In a preferred embodiment the "sum" command performs the Checksum of each test file.

In step 422, the present invention individually compares the Checksum of the original test "Test1" 310 to each of the three copied test files. If in step 424, the Checksums of the original test file and one or more of the copied test files are not equal then a data caching error occurred in step 404 when the three files were copied from the original test file. More specifically, in step 424, if the Checksum of the original test file, "Test1" 310 is not equal to at least one of the copied test files, "Test01" 312, "Test02" 314, and "Test03" 316, then a data caching error occurred when the copied files were created in response to the copy command.

When there is a data caching error, the data compare program writes a "DATA COMPARE ERROR" to the log and lists the file number, file name and Checksum of the original test file "Test1" 310 and the copied test files, "Test01" 312, "Test02" 314 and "Test03" 316. Once, the present invention identifies the caching error and writes the error to a log, the present invention, deletes the test files and terminates the program.

In step 424, if the Checksum of the original test file, "Test1" 310 and the copied test files, "Test01" 312, "Test02" 314 and "Test03" 316 are equal then a data caching error did not occur when the copied test files were created in response to the copy command. If a data caching error did not occur, the data compare error detection program writes a pass and the date and time of its occurrence to a log.

Since a data caching error may be a very intermittent failure and therefore a difficult failure to detect, determining whether a CPU module 200 will produce caching errors may require numerous iterations of the data compare error detection process. Thus, when a data caching error is not detected, after step 426, the present invention writes the pass information to the log, deletes the three duplicate files, "File01" 312, "File02" 314 and "File03" 316, and returns to step 404 to create three new copies of the original test file "Test1" 310. The data compare process will continue to test the CPU module 200 to detect cashing errors until either the process detects an error or the operator of the data compare software is satisfied that the CPU module 200 will not generate caching errors, and terminates data compare process.

FIG. 5 is a flowchart showing an example of the data compare detection of caching errors of FIG. 4. Although FIG. 5 shows only a 24 bit test file, one of ordinary skill in the art will understand that the example is representative of the data compare detection of caching errors where a test file has a preferred length of 15 megabytes. In step 500, as shown, the present invention builds the 24 bit test file, "Test File 1" 310 comprised of "1" and "0"s. In step 504, "Test File 1" 310 is copied to "Test File01" 312, TestFile02" 314, and TestFile03" 316.

When the CPU module 200 executes the copy command, data is read from disk 108 to physical memory 104 and then is written back to disk 108. If during this process one or more data bits of the copied files incorrectly flips, it indicates that a data caching error has occurred. For example, FIG. 5 shows a data caching error where bit 511 of "Test File03" 316 incorrectly flips from "0" to "1", when in step 404 the "Test File1" 502 was copied to "Test File03" 316. Although, it is highly unlikely that this data caching problem would ever occur with a 24 bit test example, it is representative of the data caching error that is more likely to occur when a memory intensive program processes files with megabytes or gigabytes of data.

The following steps determine whether a data cache error occurred when the original test file "Test File1" 310 was copied to the files "Test File01" 312, "Test File02" 314 and "Test File03" 316. In step 512, the present invention performs a Checksum of the original and copied test files. As shown, in step 512, the present invention generates "Checksum1" 514 for "TestFile1" 310, "Checksum01" 514 for TestFile01" 312, "Checksum02" 516 for TestFile02" 314 and Checksum03" 520 for TestFile03" 316.

In step 522, the steps of 524, 526 and 528 of the present invention compare the Checksums of the original file to the Checksum of each copied file. The comparison of Checksum1 514 of the original test file Test File1 310 and Checksum01 516 of the first copied test file Test File01 312 results in a pass since the Checksums, as shown, are both equal to "160." The comparison of Checksums between Checksum1 514 of the original test file Test File1 310 and Checksum02 518 of the second copied test file Test File02 314 results in a pass since the Checksums, as shown, are also both equal to "160." However, the comparison of Checksum1 514 to Checksum03 520 of the third copied test file Test File03 316 results in an error since the Checksums, as shown, differ in value. This Checksum difference between "160" and "162" indicates that a caching error occurred, an error that was the result of the Test File03's bit 511 flipping from a "0" to a "1" during the copy process.

The present invention deletes the copied files and writes the results of the data compare of the Checksums to a log. In step 530, the present invention displays the log that identifies the error.

Although not shown, if each copied file passes the data compare process, the present invention performs another iteration, where, in step 504, it copies the original Test File 1 310 to three new test files. This data compare process will is continue until either the Checksum process detects a data caching error or the operator of the process is satisfied that the CPU model 200 will not cause such an error.

FIG. 5 shows for the sake of clarity an example data compare process that detects a data caching error in one iteration of this test loop. However, one of ordinary skill in the art will understand that it is more likely that the present invention will perform numerous iterations before determining whether a CPU module has a propensity to cause caching errors.

A preferred embodiment of the present invention has been described. It will be understood that various modifications may be made without departing from the spirit and scope of the invention.

In describing the preferred embodiments, a number of specific technologies used to implement the embodiments of various aspects of the invention were identified and related to more general terms in which the invention was described.

It should be understood, however, that such specificity is not intended to limit the scope of the claimed invention.

We claim:

1. A method for performing data compare detection of a memory error of a computer memory subsystem, the method comprising the following steps, performed by a computer system having the memory subsystem, of:
    copying a test file from a secondary memory to create a plurality of other test files in the secondary memory, the copying step causing the test file to be written to the computer memory subsystem;
    generating a checksum value for the test file and for each of the other test files; and
    comparing the checksum value of the test file to the checksum value of each of the other test files, wherein if the checksum value of the test file is not equal to the checksum value of each of the other test files the method detects the memory error, wherein if the checksum value of the test file is equal to the checksum value of each of the other test files the method does not detect the memory error.

2. The method as recited in claim 1, further comprising the step of building the test file.

3. The method as recited in claim 2, wherein the building step includes the steps, of:
    entering a series of data-bits into the test file; and
    copying the series of data-bits into the test file until it has reached a testing size.

4. The method as recited in claim 3, wherein the testing size of the copying step is 15 megabytes.

5. The method as recited in claim 1, further comprising the step, of writing results of the comparing step to a log.

6. The method as recited in claim 5, wherein the log of the writing step includes a name and the checksum value of the test file and of each of the other test files, and a result indicator identifying if the performing step passed or failed.

7. The method as recited in claim 5, further comprising the step, of displaying the log.

8. The method as recited in claim 1, wherein the plurality of other test files of the copying step are three other test files.

9. The method as recited in claim 1, wherein the memory error is a data caching error.

10. An apparatus for providing data compare detection of a memory error of a computer memory subsystem, the apparatus comprising:
    a first portion configured to copy a test file from a secondary memory to create a plurality of other test files in the secondary memory, the first portion causing the test file to be written to the computer memory subsystem to create a plurality of other test files;
    a second portion configured to generate a checksum value for the test file and for each of the other test files; and
    a third portion configured to compare the checksum value of the test file to the checksum value of each of the other test files, wherein if the checksum value of the test file is not equal to the checksum value of each of the other test files there is the memory error, wherein if the checksum value of the test file is equal to the checksum value of each of the other test tiles there is not the memory error.

11. The apparatus as recited in claim 10, further comprising:
    a fourth portion configured to build the test file;
    a fifth portion configured to write results of the third portion to a log; and
    a sixth portion configured to display the log.

12. The apparatus as recited in claim 11, wherein the fourth portion further includes:
    a portion configured to enter a series of data-bits into the test file; and
    a portion configured to copy and to paste the series of data-bits into the test file until it has reached a testing size.

13. The apparatus as recited in claim 11, wherein the testing size of the copying step is 15 megabytes.

14. The apparatus as recited in claim 11, wherein the log of the fifth portion includes a name and the checksum value of the test file and of each of the other test files, and a result indicator identifying if the apparatus detects the memory error.

15. The apparatus as recited in claim 10, wherein the memory error is a data caching error.

16. A computer program product comprising:
    a computer usable medium having computer readable code configured to cause data compare detection of a memory error of a computer memory subsystem, the computer program product comprising:
    a first computer readable program code device configured to cause a computer to effect copying a test file from a secondary memory to create a plurality of other test files in the secondary memory, the copying step causing the test file to be written to the computer memory
    a second computer readable program code device configured to cause a computer to effect generating a checksum value for the test file and for each of the other test files; and
    a third computer readable program code device configured to cause a computer to effect comparing the checksum value of the test file to the checksum value of each of the other test files, wherein if the checksum value of the test file is not equal to the checksum value of each of the other test files there is the memory error, wherein if the checksum value of the test file is equal to the checksum value of each of the other test tiles there is not the memory error.

17. The computer program product as recited in claim 16, further comprising:

a fourth computer readable program code device configured to cause a computer to effect building a test file;

a fifth computer readable program code device configured to cause a computer to effect writing results of the third device to a log; and a sixth computer readable program code device configured to display the log.

18. The computer program product as recited in claim 16, wherein the memory error is a data caching error.

19. A computer apparatus storable on a computer usable medium comprising computer readable code configured to cause compare data compare detection of a memory error of a computer memory subsystem, the computer apparatus comprising:

a first computer readable program code device configured to cause a computer to effect copying a test file from a secondary memory to create a plurality of other test files in the secondary memory, the copying step causing the test file to be written to the computer memory a second computer readable program code device configured to cause a computer to effect generating a checksum value for the test file and for each of the other test files; and a third computer readable program code device configured to cause a computer to effect comparing the checksum value of the test file to the checksum value of each of the other test files, wherein if the checksum value of the test file is not equal to the checksum value of each of the other test files there is the memory error, wherein if the checksum value of the test file is equal to the checksum value of each of the other test tiles there is not the memory error.

20. The computer apparatus as recited in claim 19, wherein the computer readable code is configured for transference over a network.

* * * * *